United States Patent
De Coi et al.

(10) Patent No.: US 10,845,483 B2
(45) Date of Patent: Nov. 24, 2020

(54) METHOD FOR READING A DEMODULATION PIXEL AND DISTANCE SENSOR

(71) Applicant: ESPROS Photonics AG, Sargans (CH)

(72) Inventors: Beat De Coi, Maienfeld (CH); Martin Popp, Chur (CH)

(73) Assignee: ESPROS Photonics AG, Sargans (CH)

( * ) Notice: Subject to any disclaimer, the term of this patent is extended or adjusted under 35 U.S.C. 154(b) by 398 days.

(21) Appl. No.: 15/857,827

(22) Filed: Dec. 29, 2017

(65) Prior Publication Data
US 2018/0203117 A1    Jul. 19, 2018

(30) Foreign Application Priority Data

Jan. 13, 2017   (EP) .................................. 17 151 300

(51) Int. Cl.
| | |
|---|---|
| *G01S 17/32* | (2020.01) |
| *G01S 17/89* | (2020.01) |
| *G01S 7/491* | (2020.01) |
| *G01S 7/4913* | (2020.01) |
| *G01S 7/4863* | (2020.01) |
| *H01L 27/146* | (2006.01) |

(52) U.S. Cl.
CPC ............ *G01S 17/32* (2013.01); *G01S 7/4863* (2013.01); *G01S 7/4913* (2013.01); *G01S 17/89* (2013.01); *H01L 27/14609* (2013.01)

(58) Field of Classification Search
CPC ........ G01S 17/32; G01S 7/4913; G01S 17/89; G01S 7/4863; G01S 17/894; H01L 27/14609
USPC ........................................................ 356/4.01
See application file for complete search history.

(56) References Cited

U.S. PATENT DOCUMENTS

| | | | |
|---|---|---|---|
| 2008/0079833 A1 | 4/2008 | Ichikawa et al. | |
| 2014/0160459 A1 | 6/2014 | Huber et al. | |

FOREIGN PATENT DOCUMENTS

| | | |
|---|---|---|
| EP | 2 187 237 A1 | 5/2010 |
| EP | 2 743 724 A1 | 6/2014 |
| WO | 2010/144616 A1 | 12/2010 |

*Primary Examiner* — Daniel L Murphy
(74) *Attorney, Agent, or Firm* — Burr & Brown, PLLC

(57) ABSTRACT

A method for reading a demodulation pixel of a distance sensor for determining a distance, in particular for determining the difference between two charge quantities independently of the total magnitude of the charge quantities, and also a distance sensor are proposed. For faster signal processing, provision is made for applying a variable control voltage to the transfer gates for influencing the potential wall, and lowering the respective potential walls of the corresponding transfer gates, before and/or until from the storage gates in each case charge carriers can surmount the respective potential wall of the corresponding transfer gate and pass to the assigned floating diffusion.

18 Claims, 14 Drawing Sheets

METHOD FOR READING A DEMODULATION PIXEL AND DISTANCE SENSOR

This application claims the benefit under 35 USC § 119(a)-(d) of European Application No. 17 151 300.5 filed Jan. 13, 2017, the entirety of which is incorporated herein by reference.

FIELD OF THE INVENTION

The present invention relates to a method for reading a demodulation pixel, and to a distance sensor.

BACKGROUND OF THE INVENTION

Inter alia, WO 2010/144616 A1 discloses a so-called minimum charge transfer method (MCT). An arbitrary background (background light, etc.) is regularly superimposed on that portion of an optical signal which carries the information to be communicated. In order to eliminate the background, the optical signal can firstly be recorded by two channels of a photodetector, wherein the incident photons induce mobile charge carriers in the photodetector. This is followed by making use of, or assuming as a basis, the fact that the background portion occurs in equal portions in charge carrier quantities divided between both channels, such that the difference can be determined from corresponding charge carrier quantities in order to eliminate the background portion. The charge carriers can firstly be collected over a certain time period in each case in a collecting unit (storage gate). In addition, a second region (for example, a floating diffusion) is provided, the potential of which can be measured, wherein a transfer of the charge carriers from the storage gate into the floating diffusion is firstly locked by a barrier formed by a so-called transfer gate. The respectively divided charge carrier quantities are thus trapped in the respective storage gates, that is to say as it were in a potential well, while they are collected there. By changing the potential of the respective storage gate, according to the MCT method, the well depth of the storage gates is reduced until from one of the storage gates charges can surmount the potential barrier of the transfer gate and flow to the corresponding floating diffusion. In the case of different charge carrier quantities in the floating diffusions, with continuous variation of the well depth of the storage gates, firstly charge carriers can flow away to the floating diffusion only from one storage gate and then, with further reduction of the well depth, from both storage gates. The difference between the two charge quantities results from the potential differences that can be determined in this way.

SUMMARY OF THE INVENTION

It is an object of the present invention to be able to provide a method for reading a demodulation pixel and a distance sensor by which faster processing is made possible.

The method according to the present invention serves for reading a demodulation pixel of a distance sensor that is used for determining the distance to an object. In particular, in this case, the difference between two charge carrier quantities can also be determined independently of the total magnitude of the charge quantities. In connection with a distance sensor, it may be appropriate, in particular, to use demodulation pixels for receiving the radiation: first of all, the received radiation is converted into photoinduced charge carriers in a conversion region. For further detection and processing, the charge carriers can be extracted from the corresponding conversion region, generally the bulk region of a weakly doped semiconductor material, for instance, by a voltage being applied. The charge carriers can be divided into at least two charge carrier quantities alternately, specifically in a manner predefined according to a modulation frequency. Via a temporal correlation, it is thus also possible to determine phase properties of the detected light in comparison with the originally emitted light signal. For this purpose, the divided charge carrier quantities are firstly trapped and collected in each case in a potential well, wherein each potential well is respectively assigned to individual storage gates. This collection of the charge carriers corresponds to a temporal integration. A sidewall of such a potential well of a storage gate is formed by a so-called transfer gate, which acts as it were as a lock between the storage gate and a floating diffusion. The charge carrier quantity can be measured in the respective floating diffusions.

In contrast to the prior art, the present invention provides for varying the height of the potential wall formed by the transfer gate, for which purpose a variable control voltage is applied to the respective transfer gates. Thus, in contrast to what has been provided hitherto in the prior art, the potential well depth of the storage gate is not or not exclusively reduced until charge carriers can surmount the potential wall of the respective transfer gates and flow across to the floating diffusion.

In principle, various embodiments are conceivable in which, for example, besides the height of the potential wall of the transfer gate, the well depth of the corresponding storage gates is also changed. Both, namely the height of the potential wall and the well depth of the storage gates, can be varied simultaneously or at different times. Preferably, it is possible to vary firstly the height of the potential wall of the transfer gate and then the well depth of the storage gates.

The present invention makes it possible to suppress particularly effectively the background superimposed on the actual signal.

The method according to the present invention makes it possible to detect optical signals which, in contrast to the background superimposed on the signals, have a comparatively low intensity. In this case, charge carriers generated, for example, by a photodetector upon reception of an optical signal are divided in e.g. two different storage gates.

In principle, it is conceivable to divide the same signal in parallel or simultaneously between two different channels or to record it using two different channels. In this case, it can be assumed that the same background is superimposed in both channels. In the present case, the method according to the present invention is applied to distance sensors, although the signal is divided in a temporal sequence, that is to say that the photoinduced charge carriers are temporally successively allocated to different collecting units (storage gates). The respective time periods in which the charge carriers are allocated to the respective collecting units (storage gates) are of equal length among one another.

In particular, so-called TOF sensors (TOF: Time of Flight) are used as distance sensors. With regard to the background superimposed on the actual signal carrying the information, it can regularly be assumed that said background changes only slowly over time.

Furthermore, the charge carriers are divided according to a modulation frequency. The modulation frequency is also the frequency which is superimposed on the emitted light signal in the distance sensor operating as a TOF sensor, in order finally to determine the distance. By way of example, a signal of low frequency in comparison with the light frequency is superimposed on the light pulse to be emitted, and, finally, the phase difference is determined which arises when the light covers a specific distance to an object and the signal reflected back is detected in the distance sensor.

The superimposed background may be, for example, a background light such as, for example, natural daylight/sunlight or the light generated by a lamp situated in the vicinity (common-mode background). The dark current, for instance, as a result of charge carriers generated thermally in the semiconductor material of the sensor, may also contribute to this. For this reason, it may also be assumed that the change in this light takes place, if at all, at much longer time intervals, at least in comparison with the period duration of the modulation frequency.

It can be assumed that the difference between two signals for which photoinduced charge carriers are collected in a temporal sequence is suitable for substantially illuminating the background. This is because the integration times in which charge carriers are collected in the storage gates are typically in the microseconds or sub-microseconds range, while the changes in the background may often be expected, if at all, only in the hours range. Moreover, such changes in the background light generally take place at most continuously rather than abruptly.

The method according to the present invention enables very much faster signal processing because very much smaller capacitances have to be driven. In particular, it is advantageous that a variable control voltage can be applied to the transfer gate and the height of the potential wall can thus be influenced: in conventional methods according to the prior art, the potential wall made available in the transfer device had to have a finite height that was kept constant in order that, upon reduction of the well depth of the respective storage gates, there is also the possibility of the charge carriers surmounting the potential wall of the respective transfer device in order finally to pass into a detection region (floating diffusion). Once the level at which charge carriers can surmount the potential wall has been reached, however, in conventional sensors according to the prior art hitherto, it has proved to be difficult to stop the flow of charge carriers across the potential wall without delay solely by the well depth of the respective storage gate no longer being changed and being kept constant. This disadvantageous effect can be eliminated according to the present invention, however, by virtue of the height of the potential wall being raised, such that a barrier between storage gate and floating diffusion arises again. The charge transfer between storage gate and floating diffusion can thus be stopped particularly effectively according to the present invention. The accuracy of the measuring method can also be improved as a result.

Furthermore, the method according to the present invention is distinguished by the fact that it can be implemented in a simple manner, nor does it require any fundamental changes to the detector layout used hitherto.

The passage of the charge carriers to the respectively assigned floating diffusion can be stopped as soon as from two of the storage gates in each case charge carriers correspondingly pass. Firstly from the storage gate in which a larger charge carrier quantity has accumulated charge carriers will be able to pass to the corresponding floating diffusion because in this case the potential wall of the transfer gate can be surmounted faster. If the potential wall is lowered further or the well depth of the storage gates is reduced, then at a later point in time charge carriers of the corresponding other storage gate will likewise be able to pass to the floating diffusion. The potential difference between the two floating diffusions can now be determined at this point in time, the difference between the charge carrier quantities resulting therefrom. Advantageously, this determination can also be carried out independently of the total magnitude of the charge carrier quantities, that is to say that it is possible largely to disregard the intensity of the background radiation, without the actual information-carrying signal having to be amplified beforehand.

In order, as already explained above, to be able to achieve particularly effective stopping of the passage of charge carriers, the potential wall between storage gate and floating diffusion can be raised again in one exemplary embodiment of the present invention, such that the transfer of the charge carriers from the potential well of the storage gate to the floating diffusion can be practically prevented since otherwise, in the case of sensors known from the prior art, charge carriers continue to pass to the floating diffusion even if the well depth of the storage gate or the control voltage applied to the storage gate is no longer changed.

It may prove to be particularly advantageous in one exemplary embodiment that in the state in which the charge carriers are trapped in the potential well of a storage gate, the potential wall of the transfer gate is very high in order to enable effective stopping of the charge carriers or retention of the charge carriers in the potential well. In this state, the well depth of the storage gate or the control voltage of the storage gate is not varied in the first place to such a great extent that the charge carriers are raised to the level of the very much higher potential wall of the transfer gate. The height of the potential wall is lowered only when the charge carriers are intended to pass across to the floating diffusion.

Embodiment variants of the present invention are conceivable, in principle, in which the change in the control voltage at the transfer gate and/or at the storage gate is carried out continuously or in jumps. If the charge carriers collected in the storage gate are not very far from the upper edge of the potential wall at the transfer gate, such that flowing across to the floating diffusion should soon be expected, it is generally advantageous, for reasons of accuracy, to change the corresponding control voltage continuously or constantly in order that the point at which this flowing across to the floating diffusion becomes possible is not missed or skipped. In principle, the corresponding control voltage is the voltage that ensures that the charge carriers in the storage gate reach the corresponding level in comparison with the height of the potential wall, that is to say, that the voltage is the control voltage at the storage gate and/or at the transfer gate.

The determination of the potential difference in the floating diffusions can be carried out at various points in time, in principle, namely:

precisely at the point in time when charge carriers from the (two) corresponding storage gates cross to the respective floating diffusions, precisely at the point in time when charge carriers still cross from both potential wells of the storage gates, i.e. shortly before the charge carrier quantities are exhausted in both potential wells, or during the time period between the two points in time mentioned above.

All three options can be used in principle. Depending on which of the three options is chosen, it may be advantageous to determine the potential of the corresponding floating diffusion in relation to a respective other reference value. If the potentials of the respective floating diffusions are determined at identical points in time, in order to measure the difference between them, these potential values can be measured with respect to the same reference value, in principle. For this purpose, in one exemplary embodiment, provision can be made of a comparison device that compares the measured potential with a reference value, that is to say, that an operational amplifier (comparator) is provided, for example, which is connected up to the reference value potential, on the one hand, and to the potential of the corresponding floating diffusion, on the other hand. This type of circuit advantageously has the result that the signals are subsequently (proceeding from the output of the operational amplifier) present in digital form and can correspondingly be evaluated by means of a circuit logic. However, if the potentials are determined at different points in time, for example, different reference values can also be used, in principle.

It has already been explained that in principle there are various possibilities for bringing the respectively collected charge carrier quantities into the region of the upper edge of the potential wall, thereby enabling the charge carriers to flow across to the respective floating diffusion: on the one hand, the height of the potential wall can be lowered for this purpose, while the depth of the potential well can also be reduced, on the other hand. For this purpose, it is necessary to vary a respective control voltage, which is applied to the transfer gate in one case and to the storage gate in the other case.

In one preferred development of the present invention, firstly the height of the potential wall of the transfer gate is influenced or reduced. If charge carriers have still not flowed to the floating diffusion during the lowering of the potential wall, this lowering of the potential wall is stopped at a predefined point in time or at a predefined height of the potential wall (for instance at half of the maximum well depth at the storage gate), wherein the depth of the potential well of the storage gate is subsequently reduced (for this purpose, the potential of the storage gate is reduced in the case of the present circuitry). This is done at least for as long as until correspondingly charge carriers can respectively surmount the potential wall. In principle, however, it is also conceivable to vary the height of the potential wall and the depth of the potential well simultaneously by the control voltages of the transfer gate and of the storage gate being varied simultaneously.

In the preferred embodiment wherein the corresponding gates are varied successively, the advantage with regard to control may consist in the fact that the change in the potential wall does not have to change sign abruptly in its temporal profile. In order to enable the charge carriers to flow across to the floating diffusion, the potential of the potential wall would otherwise firstly have to be reduced and, in order to stop this passage again, it would have to be increased again directly afterward. This change of sign would have to take place comparatively abruptly. It is, therefore, advantageous if this last section before the charge carriers surpass the potential wall is brought about by a variation of the control voltage of the storage gate, that is to say, that the depth of the potential well is reduced. For the sake of completeness, it should be mentioned that possible tunnel effects, according to which tunnelling of charge carriers through a barrier is possible from the standpoint of quantum mechanics, are not taken into consideration, or are taken into consideration only to a limited extent, in the present case.

In order to enable an effective separation of the charge carriers, in particular, according to the modulation frequency, a corresponding separating region can be provided. Conversion of the incident photons of the optical signal to be detected into photoinduced charge carriers in a manner that is as effective as possible can advantageously be provided in a large conversion region having a sufficient thickness for photons penetrating deeply into the material. In the case of a semiconductor detector, for example, a large region of the bulk material is provided as a conversion region, for instance a weakly doped region. This region enables an effective conversion into charge carriers even when the photons have a large penetration depth.

However, the separation is carried out in an effective manner not in the entire, comparatively large conversion region, rather the charge carriers are extracted from there and fed to a separating region. This can advantageously be carried out by applying a voltage, for which purpose a so-called drift gate is provided, in particular. Consequently, with lower control voltages, it is possible to carry out a more effective separation on a smaller structural space. Overall, the sensor can thus also be fashioned very compactly.

Accordingly, a distance sensor according to the present invention is distinguished by the fact that the transfer gates are configured to vary the height of the potential walls respectively generated by the transfer gates, wherein a comparison device is furthermore provided in order to carry out a lowering of the respective potential walls before and/or until from two storage gates in each case charge carriers can surmount the respective potential wall and flow across to the corresponding floating diffusion. The advantages already described above can be achieved by means of this distance sensor according to the present invention. In particular, effective stopping of the passage of the charge carriers is possible, such that overall the signal processing times can be reduced and the accuracy can be increased.

In a particularly advantageous manner, one embodiment of the present invention also enables a particularly compact design. In principle, it is possible to assign to each demodulation pixel exactly one comparison device, which determines or compares the potentials of the floating diffusions arranged therein. However, it is also possible to assign a common comparison device to a plurality of demodulation pixels. In particular, it is possible to configure an arrangement within a matrix of demodulation pixels in a distance sensor according to the present invention such that this can be read according to rows and columns. Stipulation in respect of a row and a column results in a one-to-one assignment to a specific pixel. The evaluation result of the common comparison device can thus be assigned to exactly this pixel. Such a design can be realized with even greater saving of space and even more compactly, and furthermore with lower expenditure in terms of costs.

In principle, it is conceivable to configure a demodulation pixel wherein the charge carriers are separated into two subsets. It is also conceivable, however, for a division into four portions, for example, to be carried out according to the modulation frequency. Accordingly, correspondingly more storage gates, transfer gates and floating diffusions can then also be provided.

BRIEF DESCRIPTION OF THE DRAWINGS

Exemplary embodiments of the present invention are illustrated in the drawings and are explained more specifically below with indication of further details and advantages.

DETAILED DESCRIPTION OF THE INVENTION

Figure 1:
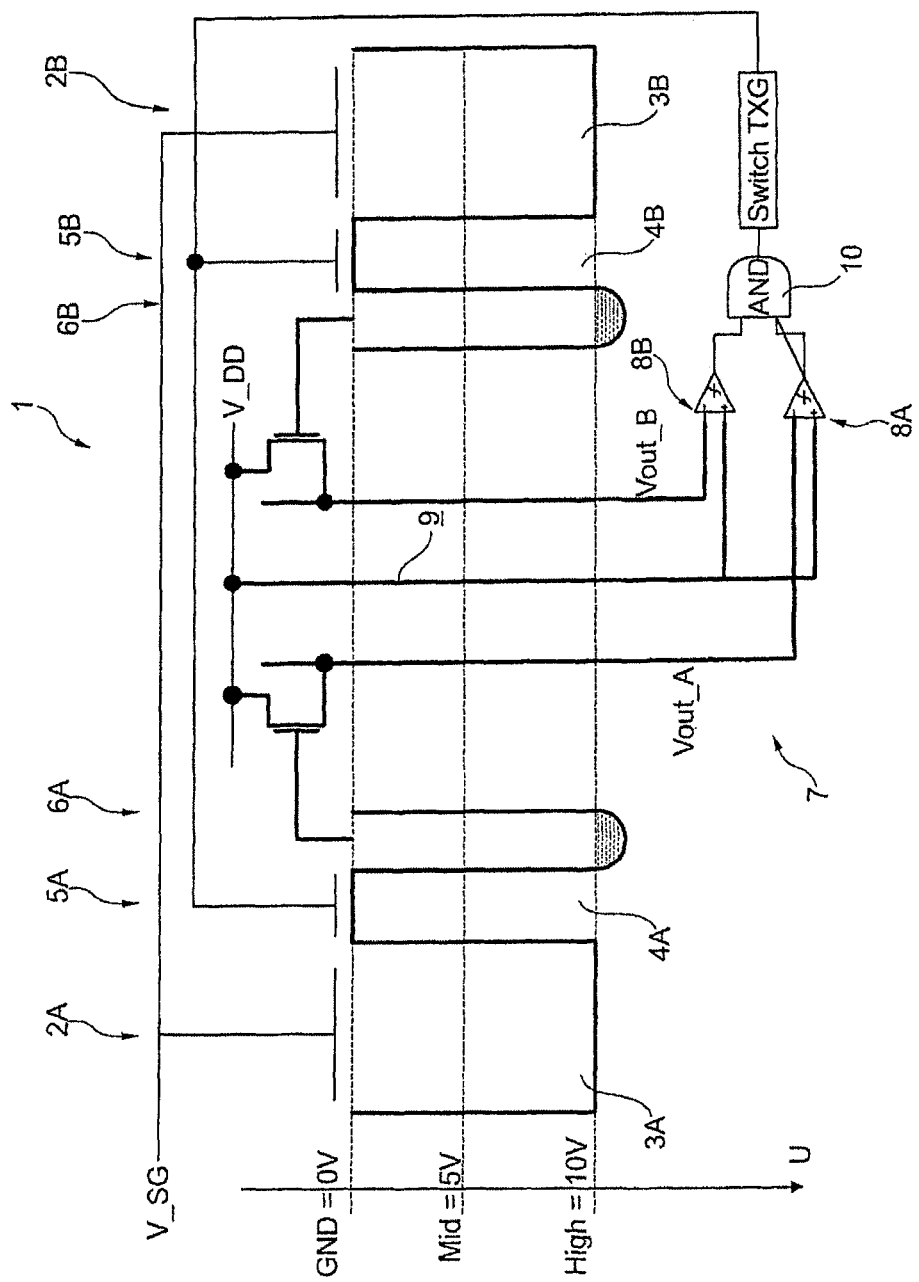
FIGS. 1-12 show a schematic illustration of the process of reading a demodulation pixel according to the present invention.
Figure 2:
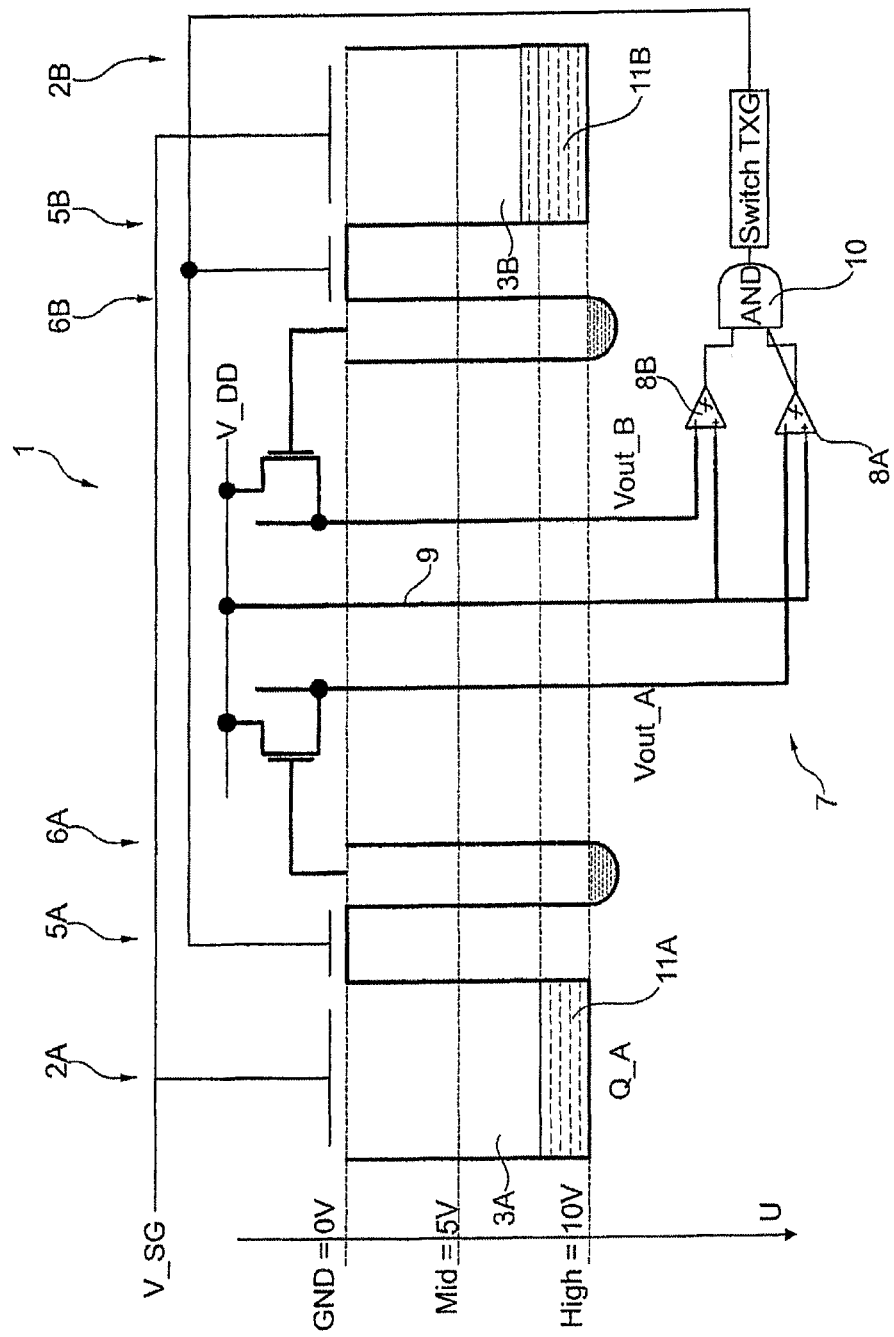

FIG. 1 shows a schematic illustration of a demodulation pixel 1. The conversion region, in which the photoinduced charge carriers are generated by photons of a signal to be detected, and the actual semiconductor topography are not illustrated in specific detail. The photoinduced charge carriers are separated according to a modulation frequency into two charge carrier quantities, which are respectively collected over a certain time interval in the storage gates 2A, 2B. For this purpose, potential wells 3A, 3B are respectively formed at the storage gates 2A, 2B. The collection of charge carriers is illustrated in FIG. 2.

In general, the two storage gates 2A, 2B in the semiconductor topography actually chosen lie respectively directly alongside a drift gate, into the region of which the charge carriers are guided from the conversion region. For better clarity, however, a different order was chosen in the illustration in the figures.

A wall of the potential well 3A and 3B is formed by the potential wall 4A and 4B, respectively, which is in turn generated by the transfer gate 5A, 5B. A variable control voltage is present at the respective transfer gates 5A, 5B. The potential walls 4A, 4B separate the potential wells 3A, 3B from the floating diffusion 6A, 6B, wherein the floating diffusions 6A, 6B in each case enable a potential measurement or a determination of the charge carrier quantities that have flowed across to them.

Furthermore, the demodulation pixel illustrated in FIG. 1 comprises a comparison device 7. For this purpose, the two floating diffusions 6A, 6B are respectively connected to one input of an operational amplifier 8A, 8B. These two operational amplifiers 8A, 8B compare the voltage value present relative to a reference potential, which is connected as a common potential to both operational amplifiers 8A, 8B via the line 9. The operational amplifiers 8A, 8B thus compare the respective potential of the floating diffusion 6A and 6B with a corresponding common reference potential (reference value) and yield a digital output "1" if said reference value is exceeded, or the value "0" if the reference value is not reached. An AND gate 10 is then used to ascertain the moment when both measured potentials of the floating diffusion 6A, 6B exceed the reference value, that is to say that charge carriers flow from both potential wells 3A, 3B over the respective potential walls 4A, 4B to the corresponding floating diffusion 6A, 6B. The voltages present are chosen such that the potential walls 4A, 4B in the present case are grounded, i.e. at 0 V. The two potential wells 3A, 3B in the present case are at +10 V. Thus, if the potential of the respective potential wells 3A, 3B is reduced, then the height of the corresponding potential wells 3A, 3B, also decreases, that is to say that the "bottom" of the potential wells 3A, 3B is raised in the illustration in FIG. 1. The potentials of the floating diffusion 6A, 6B are at a higher potential than the potential wells 3A, 3B, such that charge carriers can also tend rather to flow to the floating diffusions 6A, 6B. A middle potential value of +5 V is likewise illustrated.

The illustration according to FIG. 2 differs from that in accordance with FIG. 1 merely in that charge carrier quantities 11A, 11B have been collected in the potential wells 3A, 3B. That means that charge carriers are conducted respectively into the storage gate 2A and 2B alternately according to a predefined modulation frequency.

Figure 3:
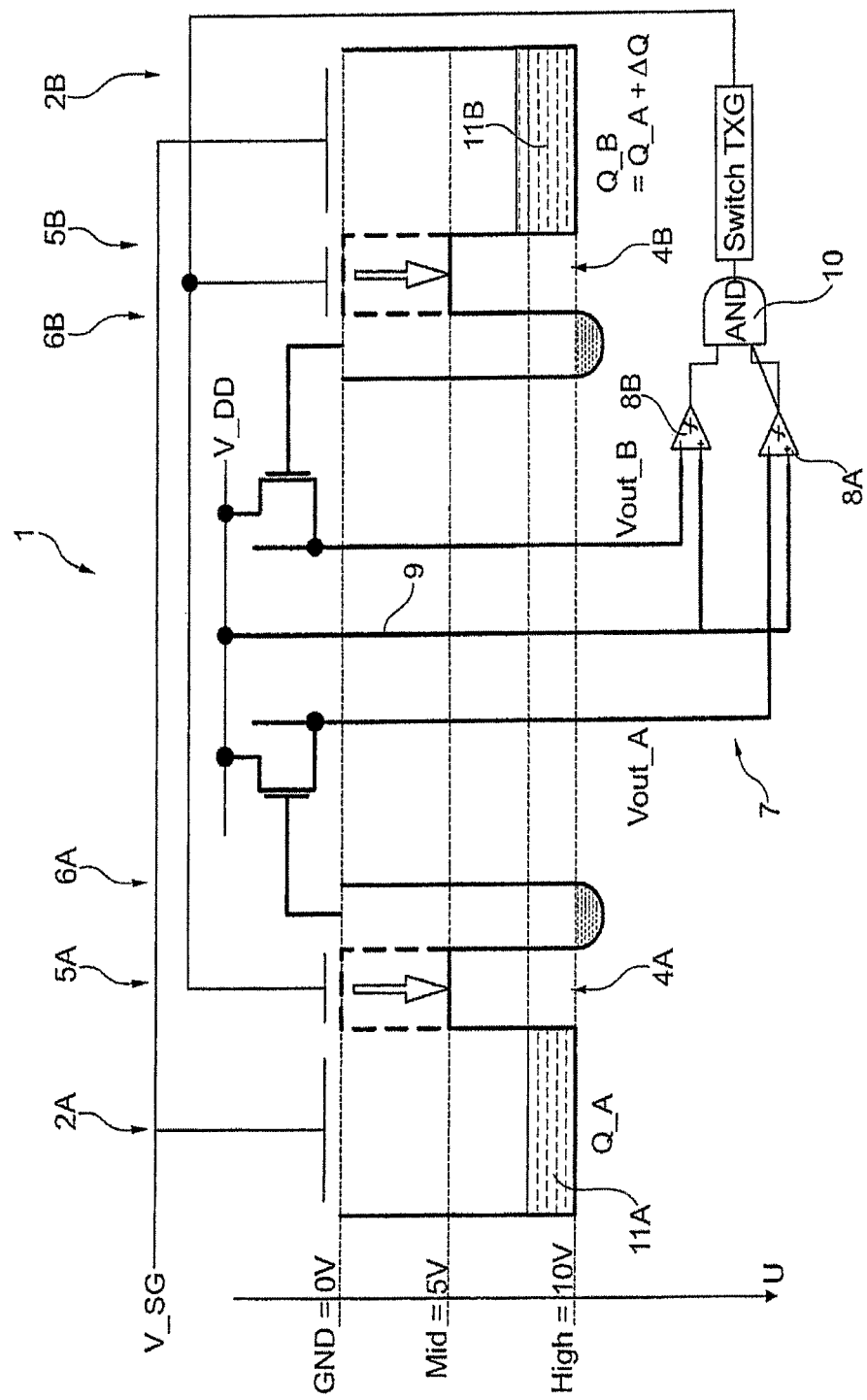
Figure 4:
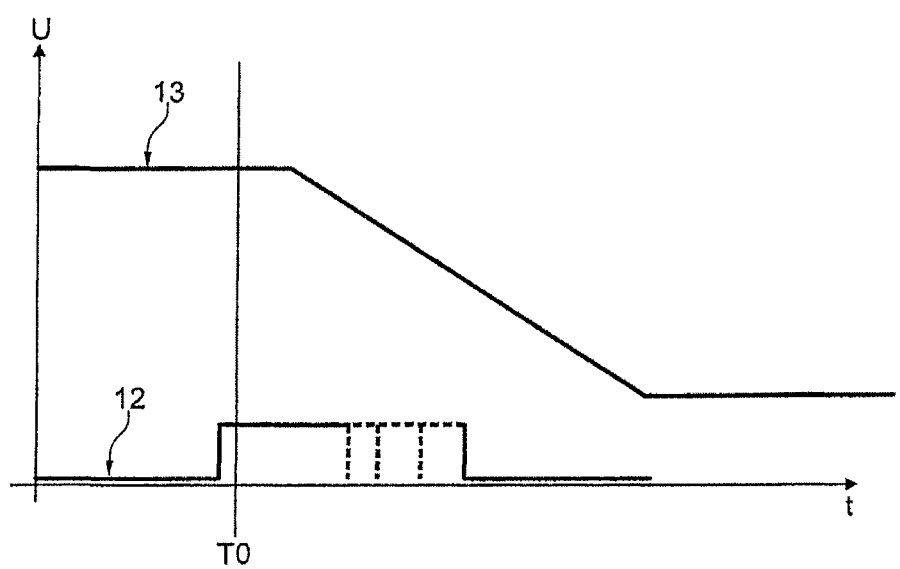

For the purpose of reading the demodulation pixel, in accordance with the illustration according to FIG. 3, the potential walls 4A, 4B are then lowered. It is evident moreover that the charge carrier quantity 11A is smaller than the charge carrier quantity 11B. The potential profile is illustrated in the diagram according to FIG. 4, wherein the potential or the applied control voltage is plotted on the axis U and time is plotted on the axis t. The voltage at the transfer gate 5A, 5B was increased simultaneously in each case, or the height of the corresponding potential walls 4A, 4B was reduced, which is shown in the diagram in accordance with FIG. 4 by an abrupt rise in the curve 12 at the point in time T0. The voltage at the storage gates 2A, 2B, represented in the curve 13, remains constant until this point in time t0.

The potential walls 4A, 4B are lowered abruptly, such that a potential value of +5 V is attained. Up until then in the present case no charge carriers have flowed from the potential well 3A or 3B across the corresponding potential walls 4A, 4B to the respective floating diffusion 6A, 6B.

Figure 5:
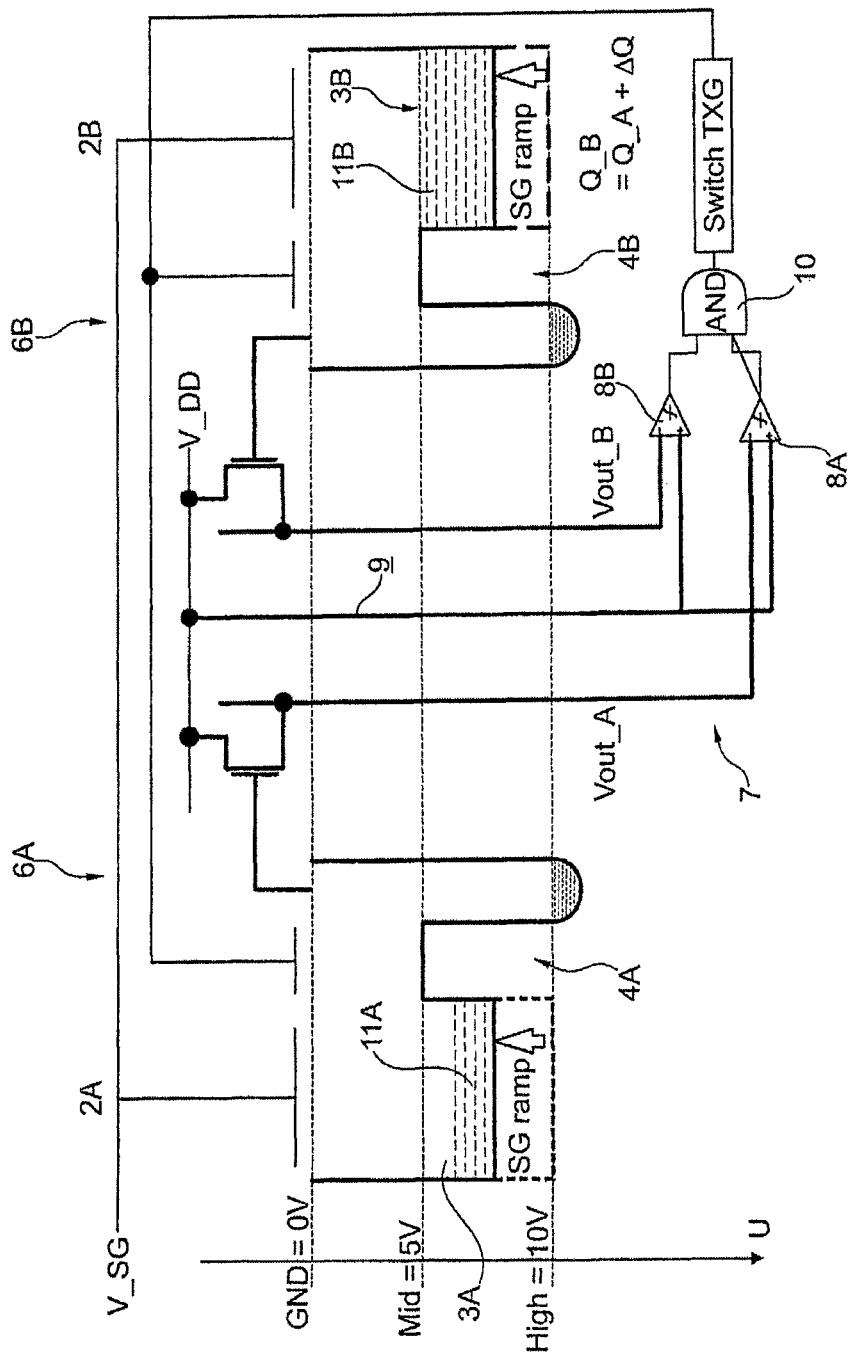
Figure 6:
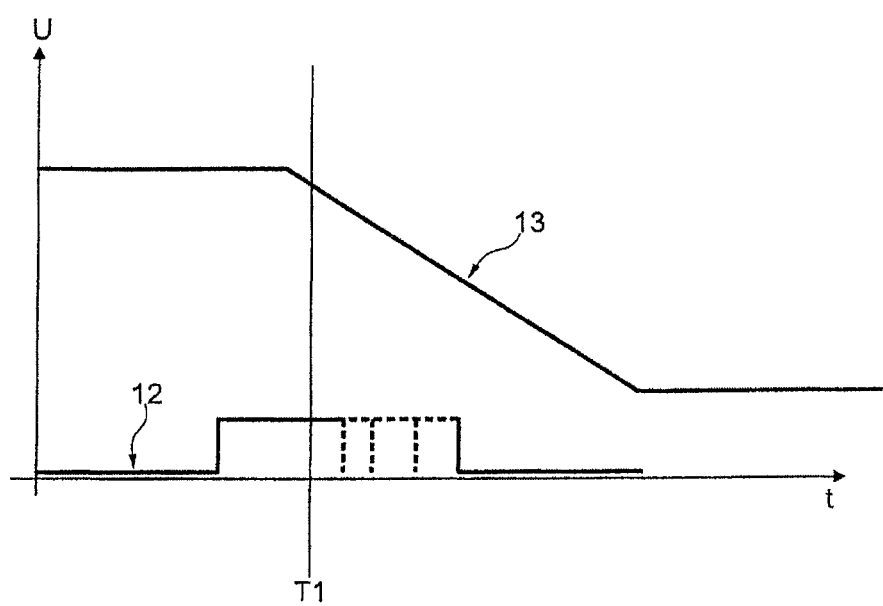

The depth of the potential wells 3A, 3B is then reduced afterward at the point in time T1 (FIG. 5) by virtue of the potential of the respective storage gates 2A, 2B likewise being reduced. The corresponding reduction of the potential of the storage gates 2A, 2B is represented in the curve 13 from FIG. 6. As is likewise evident, the potential of the curve 12 still remains constant at this point in time, that is to say that the height of the potential walls 4A, 4B does not change for the time being.

Figure 7:
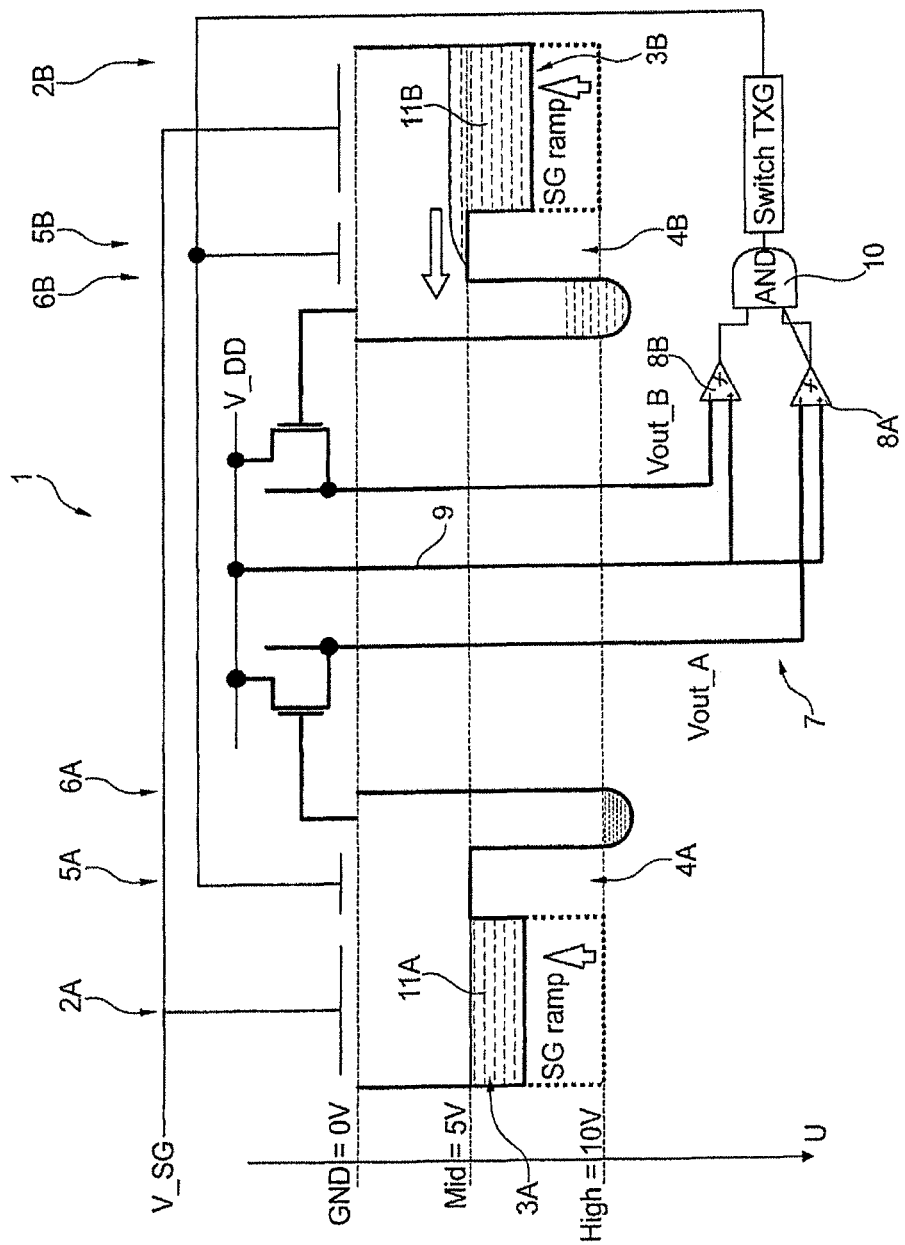
Figure 8:
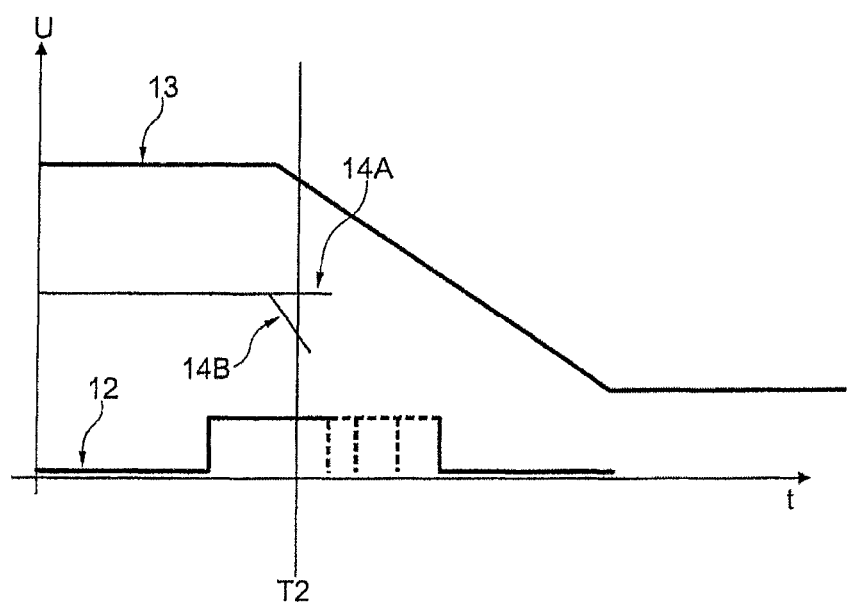

FIG. 7 in turn illustrates the point at which for the first time charge carriers from the charge carrier quantity 11B flow across in the direction of the floating diffusion 6B. This is thus the case earlier in the temporal profile for the charge carrier quantity 11B, which is larger than the charge carrier quantity 11A. FIG. 8 additionally shows the two profiles 14A, 14B of the floating diffusion 6A, 6B, wherein the profile 14A correspondingly remains constant while a potential dip can be noted at the curve 14B at the point in time T2. The more charge carriers from one of the potential wells 3A, 3B flow across into the corresponding floating diffusion 6A, 6B, the lower the corresponding potential of the floating diffusion 6A, 6B becomes.

Figure 9:
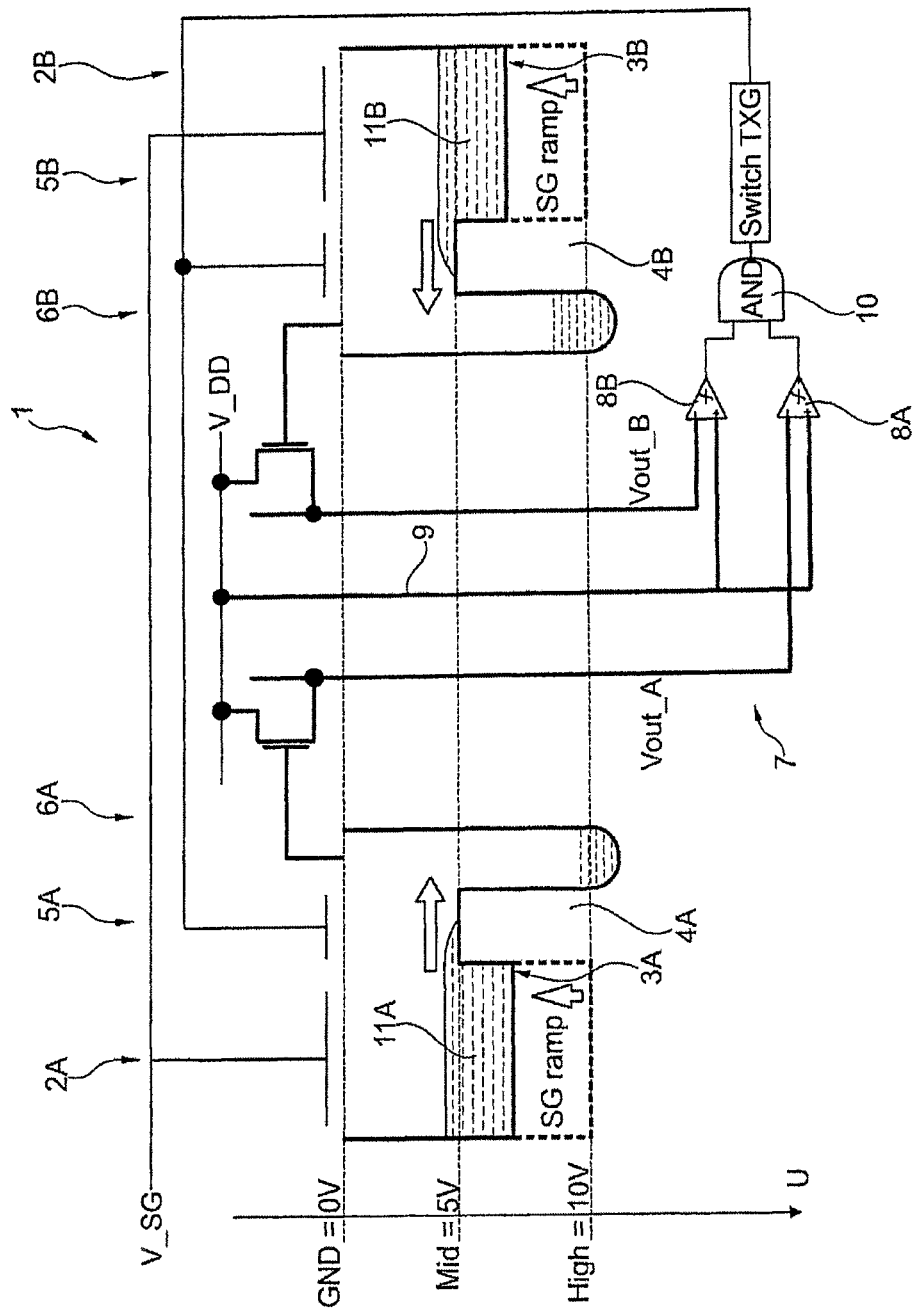
Figure 10:
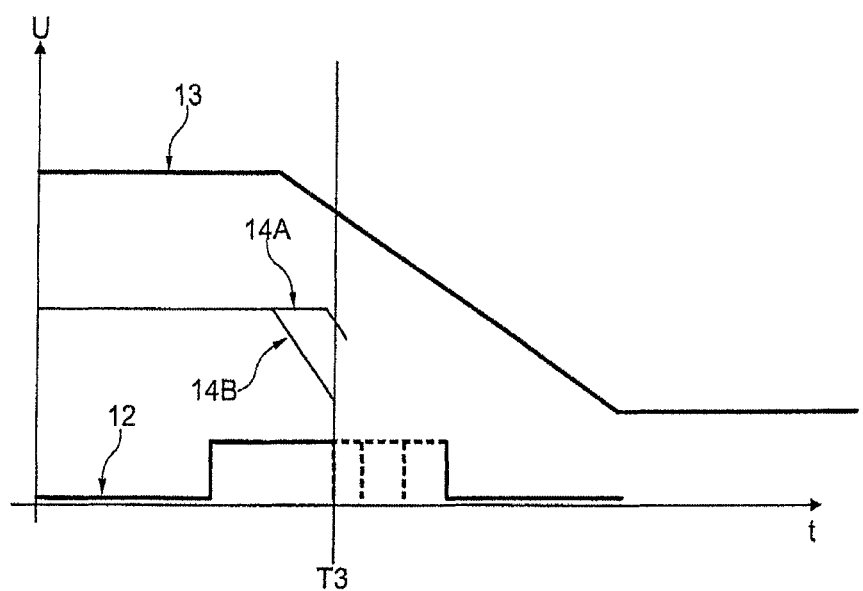

FIGS. 9, 10 describe exactly the point in time T3 at which from both potential wells 3A, 3B charge carriers flow across to the respective floating diffusion 6A, 6B. In FIG. 10, the potential curve 14A likewise acquires a bend at this point in time T3, that is to say that the potential is reduced.

Figure 11:
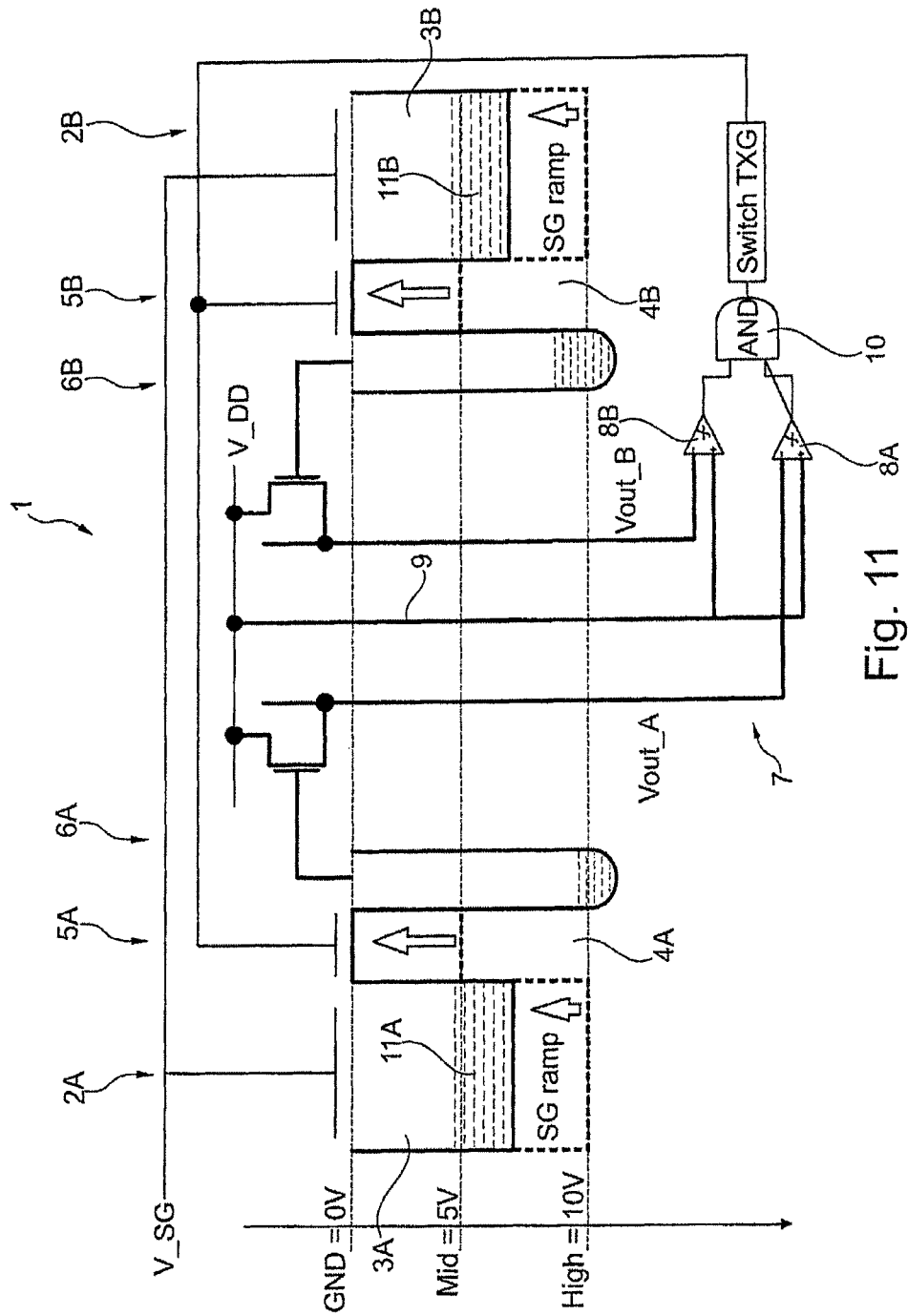
Figure 12:
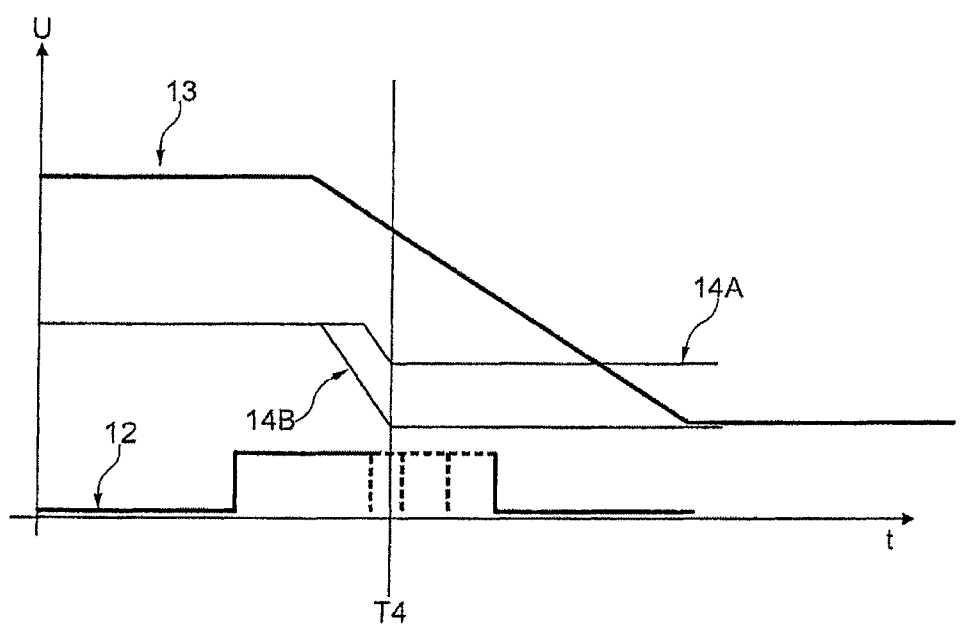

In order to stop this flow of charge carriers, in accordance with FIGS. 11, 12, the height of the potential walls 4A, 4B is raised again, that is to say that the potential of the corresponding transfer gates 5A, 5B is reduced again to 0 V. This takes place at the point in time T4. The potential difference between the two floating diffusions 6A, 6B can then also be determined. A further change in the control voltage (storage-gate ramping), as long as it is small compared with the abrupt change in the control voltage at the transfer gate, no longer changes anything in respect of the flowing of the charge carriers across to the floating diffusion being stopped, because here the potential wall established by the transfer gate is significantly too high.

Figure 13:
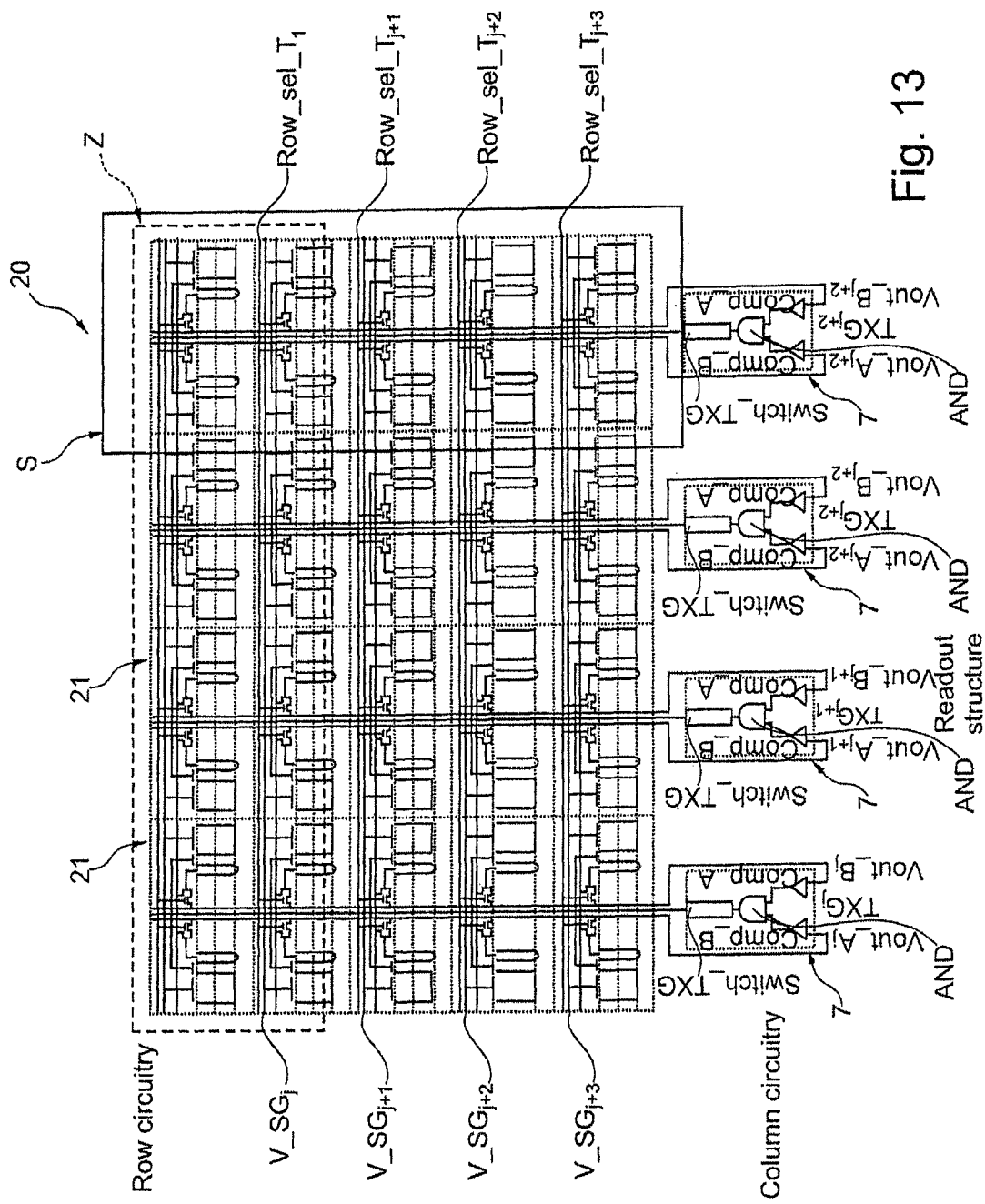
FIGS. 13-14 show a matrix arrangement of pixels in a distance sensor according to the present invention.
Figure 14:
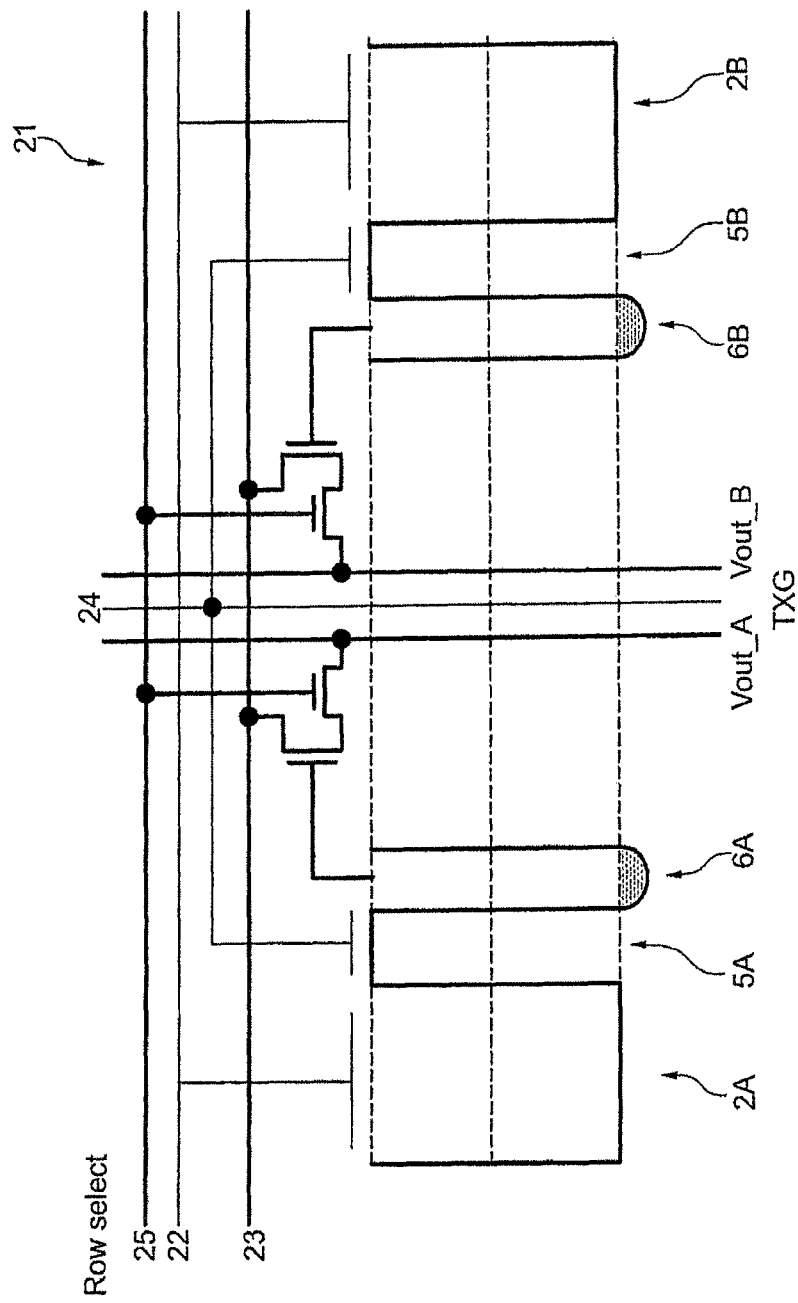

FIG. 13 in turn shows a distance sensor or a matrix arrangement 20 of demodulation pixels 21. An enlarged illustration of the circuitry of a demodulation pixel is illustrated in FIG. 14. The arrangement 20 proceeds in rows Z and columns S. As is evident from FIGS. 13, 14, common lines for the storage gates 2A, 2B (line 22) and for the reference potential (line 23) are provided row by row for each demodulation pixel of a row Z. Column by column in turn a common line 24 is provided in order to apply the variable control voltage to the transfer gates 5A, 5B of a respective column S. The readout of the matrix 20 is carried out row by row and column by column, wherein the stipulation in respect of a specific row Z and column S, respectively, automatically defines a specific demodulation pixel 21.

The rows Z are selected via a row select line 25; the selection of this line 25 ensures that the respective floating diffusions 6A, 6B are read. The driving of a line 24 in turn has the effect that the potential of the transfer gates 5A, 5B of a column S can be varied. Accordingly, it is sufficient to provide one comparison device 7 per column S.

What all the exemplary embodiments and developments of the present invention have in common is that a variable control voltage can be applied to the transfer gates; the respective potential walls of the corresponding transfer gates are lowered before and/or until from two of the storage gates in each case charge carriers can surmount the respective potential wall of the corresponding transfer gate and pass to the assigned floating diffusion. In particular, stopping the flow of charge carriers to the floating diffusion can be stopped more abruptly and more effectively. Overall, the signal processing time can additionally be reduced.

REFERENCE SIGNS 1 demodulation pixel
2A, 2B storage gate
3A, 3B potential well of the storage gate
4A, 4B potential wall
5A, 5B transfer gate
6A, 6B floating diffusion
7 comparison device
8A, 8B operational amplifier/comparator
9 line for reference potential
10 AND gate
11A, 11B charge carrier quantity
12 control voltage at transfer gates
13 control voltage at storage gates
14A, 14B potential at floating diffusion
20 matrix arrangement in distance sensor
21 demodulation pixel
22 line for storage gates
23 line for transfer gates
24 line for reference potential
25 row select line
T0 point in time (reduction of the potential wall height at the transfer gates)
T1 point in time (reduction of the well depth at the storage gates)
T2 point in time (first flowing across to a floating diffusion)
T3 point in time (second flowing across to a floating diffusion)
T4 point in time (increase in the potential wall height at the transfer gates)
t time axis
U axis for voltage/potential
S column
Z row

The invention claimed is:

1. A method for reading a demodulation pixel of a distance sensor for determining the distance to an object by using the difference between two charge quantities independently of the total magnitude of the charge quantities, comprising the following method steps:
providing a demodulation pixel for receiving radiation,
converting the received radiation in a conversion region into photoinduced charge carriers,
separating the charge carriers according to a modulation frequency into at least two charge carrier quantities,
collecting the separated charge carrier quantities respectively in the potential well of one of at least two storage gates, which are respectively assigned to the charge carrier quantities,
partitioning the at least two storage gates by a respective potential wall of a transfer gate assigned to each of the storage gates as a lock for the charge carriers collected in the assigned storage gate from a respectively assigned floating diffusion for taking up the charge carriers forwarded by the respective transfer gate and for feeding the charge carriers as voltage into an evaluation region,
comparing a potential of the respectively assigned floating diffusion with a comparison device, the comparison device including at least one operational amplifier connected to the respectively assigned floating diffusion, and a digital logic circuit electrically connected to the at least one operation amplifier,
wherein the digital logic circuit is an AND gate,
a variable control voltage is applied to the transfer gates for influencing the potential wall, and
the respective potential walls of the corresponding transfer gates are lowered, before and/or until from the storage gates in each case charge carriers can surmount the respective potential wall of the corresponding transfer gate and pass to the assigned floating diffusion.

2. The method as claimed in claim 1, wherein the passage of the charge carriers to the respectively assigned floating diffusion is stopped as soon as from two of the storage gates in each case charge carriers can surmount the respective potential wall of the corresponding transfer gate, and pass to the respectively assigned floating diffusion.

3. The method as claimed in claim 1, wherein the passage of the charge carriers to the respectively assigned floating diffusion is stopped as soon as from two of the storage gates in each case charge carriers can surmount the respective potential wall of the corresponding transfer gate and pass to the respectively assigned floating diffusion by virtue of the fact that the potential wall of the assigned transfer gates is raised again.

4. The method as claimed in claim 1, wherein the determination of the difference between the two charge carrier quantities at a point in time takes place:
as soon as from two of the storage gates in each case charge carriers can surmount the respective potential wall of the corresponding transfer gate, and pass to the respectively assigned floating diffusion and/or if the passage of the charge carriers to the respectively assigned floating diffusion is stopped and/or
as soon as from none of the storage gates any longer charge carriers can surmount the respective potential wall of the corresponding transfer gate and pass to the respectively assigned floating diffusion, but charge carriers from both storage gates previously passed to the respectively assigned floating diffusion and/or
while from both storage gates charge carriers surmount the respective potential wall of the corresponding transfer gate and pass to the respectively assigned floating diffusion.

5. The method according to claim 1, wherein the potentials of the floating diffusions are compared with a respective predefined reference potential value, wherein the reference potential values are in particular identical, and wherein the results of the comparisons are preferably evaluated by means of a logic circuit in order to ascertain the potential difference.

6. The method according to claim 1, wherein the well depth of the corresponding potential well of the assigned storage gate is reduced, before and/or until and/or at least for as long as until from two of the storage gates in each case charge carriers can surmount the respective potential wall of the corresponding transfer gate and pass to the respectively assigned floating diffusion.

7. The method according to claim 1, wherein the changes in the heights of the potential walls and/or the changes in the potential well depths take place in each case simultaneously and/or with a temporal offset.

8. The method according to claim 1, wherein the change in the well depth of the storage gates and/or the change in the heights of the potential walls are/is carried out in each case continuously and/or abruptly.

9. The method according to claim 1, wherein
the charge carriers photoinduced in the conversion region are conducted into a separating region by a voltage being applied to a drift gate, and/or
the charge carriers are separated into the at least two charge carrier quantities in the separating region alternately in accordance with the modulation frequency by virtue of their being directed in the direction of a respective one of at least two modulation gates.

10. A distance sensor for determining a distance to an object by receiving radiation reflected from the object, said radiation originating from a radiation source modulated with a modulation frequency, comprising:
a pixel matrix for recording a pixel image,
wherein the pixel matrix has at least two demodulation pixels each comprising:
a conversion region for generating photoinduced charge carriers from the received radiation,
a separating unit for separating the charge carriers according to a modulation frequency into at least two charge carrier quantities,
at least two storage gates, wherein each of the storage gates is assigned to exactly one of the separated charge carrier quantities and is configured for collecting the assigned charge carrier quantity,
at least two transfer gates, which are respectively assigned to exactly one of the storage gates, which are configured in each case as a lock for the charge carriers collected in the assigned storage gate for forwarding said charge carriers,
at least two floating diffusions, which are respectively assigned to exactly one of the transfer gates, for taking up the charge carriers forwarded by the respective transfer gate and for feeding the charge carriers as voltage into an evaluation region,
wherein
the transfer gates are configured to vary a height of the potential walls respectively generated by said transfer gates,
a comparison device including at least one operational amplifier connected to at least one of the at least two floating diffusions, and an electronic logic circuit electrically connected to the at least one operational amplifier is provided in order to carry out a lowering of the respective potential walls of the corresponding transfer gates before and/or until from two of the storage gates in each case charge carriers can surmount the respective potential wall of the corresponding transfer gate, and pass to the assigned floating diffusion; and
wherein the electronic logic circuit is an AND gate.

11. The distance sensor as claimed in claim 1, wherein one of the comparison device is assigned to each demodulation pixel or the demodulation pixels are arranged as a matrix, wherein the comparison device is assigned to one of each row or each column of the matrix.

12. The distance sensor as claimed in claim 11, wherein the comparison device is configured to stop the passage of the charge carriers to the respectively assigned floating diffusion as soon as from two of the storage gates in each case charge carriers can surmount the respective potential wall of the corresponding transfer gate, and pass to the assigned floating diffusion.

13. The distance sensor as claimed in claim 11, wherein the comparison device is configured to determine the difference between the two charge carrier quantities by comparison of the potentials of the floating diffusions.

14. The distance sensor as claimed in claim 11, wherein the storage gates are configured to vary in each case their well depth, and wherein the distance sensor and/or the comparison device are/is configured:
to reduce the well depth of the corresponding potential well of the assigned storage gate before and/or until and/or at least for as long as until from two of the storage gates in each case charge carriers can surmount the respective potential wall of the corresponding transfer gate and pass to the assigned floating diffusion and/or
to carry out the changes in the heights of the potential walls and/or the changes in the potential well depths in each case simultaneously and/or with a temporal offset.

15. The distance sensor as claimed in claim 11, wherein the separating unit has a drift gate for attracting the charge carriers from the conversion region into a separating region by applying a voltage and/or
at least two modulation gates are present in order to separate the charge carriers from the separating region by virtue of the charge carriers being directed alternately in accordance with the modulation frequency from the drift gate in the direction of the respective modulation gate, wherein the modulation gates are arranged in particular at opposite locations of the drift gate.

16. The distance sensor as claimed in claim 11, wherein the comparison device is configured to the effect that as soon as from two of the storage gates in each case charge carriers can surmount the respective potential wall of the corresponding transfer gate and pass to the assigned floating diffusion, the potential wall of the assigned transfer gates is raised again in order to stop the passage of the charge carriers to the respectively assigned floating diffusion.

17. The distance sensor as claimed in claim 11, wherein the comparison device is configured to determine the difference between the two charge carrier quantities by comparison with a predefined reference value.

18. The distance sensor as claimed in claim 17, wherein the predefined reference value is a predefined common reference value.

* * * * *